(12) United States Patent
Hsiao

(10) Patent No.: US 8,602,701 B2
(45) Date of Patent: Dec. 10, 2013

(54) CONTAINER DATA CENTER

(75) Inventor: Sheng-Chung Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 243 days.

(21) Appl. No.: 13/237,951

(22) Filed: Sep. 21, 2011

(65) Prior Publication Data

US 2012/0305443 A1 Dec. 6, 2012

(30) Foreign Application Priority Data

Jun. 3, 2011 (TW) .............................. 100119714 A

(51) Int. Cl.
*B61D 45/00* (2006.01)
*B61D 3/16* (2006.01)

(52) U.S. Cl.
USPC .............................................. 410/87; 410/33

(58) Field of Classification Search
USPC ............. 410/33, 87; 206/521, 523, 591–594; 312/249.1
See application file for complete search history.

(56) References Cited

U.S. PATENT DOCUMENTS

| | | | | |
|---|---|---|---|---|
| 5,626,231 A | * | 5/1997 | Kwong et al. | 206/523 |
| 5,708,565 A | * | 1/1998 | Fairbanks | 206/521 |
| 5,743,393 A | * | 4/1998 | Webb et al. | 206/594 |
| 5,819,943 A | * | 10/1998 | Depuy | 410/87 |
| 6,092,654 A | * | 7/2000 | Webb | 206/521 |
| 6,793,076 B1 | * | 9/2004 | Luo et al. | 206/521 |
| 2001/0020595 A1 | * | 9/2001 | Koike | 206/521 |

* cited by examiner

*Primary Examiner* — Luan K Bui
(74) *Attorney, Agent, or Firm* — Altis Law Group, Inc.

(57) ABSTRACT

A container data center includes a container, a number of cabinets arranged in the container. First and second shock-proof devices mounted to a base prevent vibration and shocks being passed to the cabinets.

8 Claims, 3 Drawing Sheets

CONTAINER DATA CENTER

BACKGROUND

1. Technical Field

The present disclosure relates to a container data center.

2. Description of Related Art

A container data center usually includes a container, and many cabinets each holding many servers and received in the container. However, during transportation of the container data center, the servers may be damaged due to vibration or shocks.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
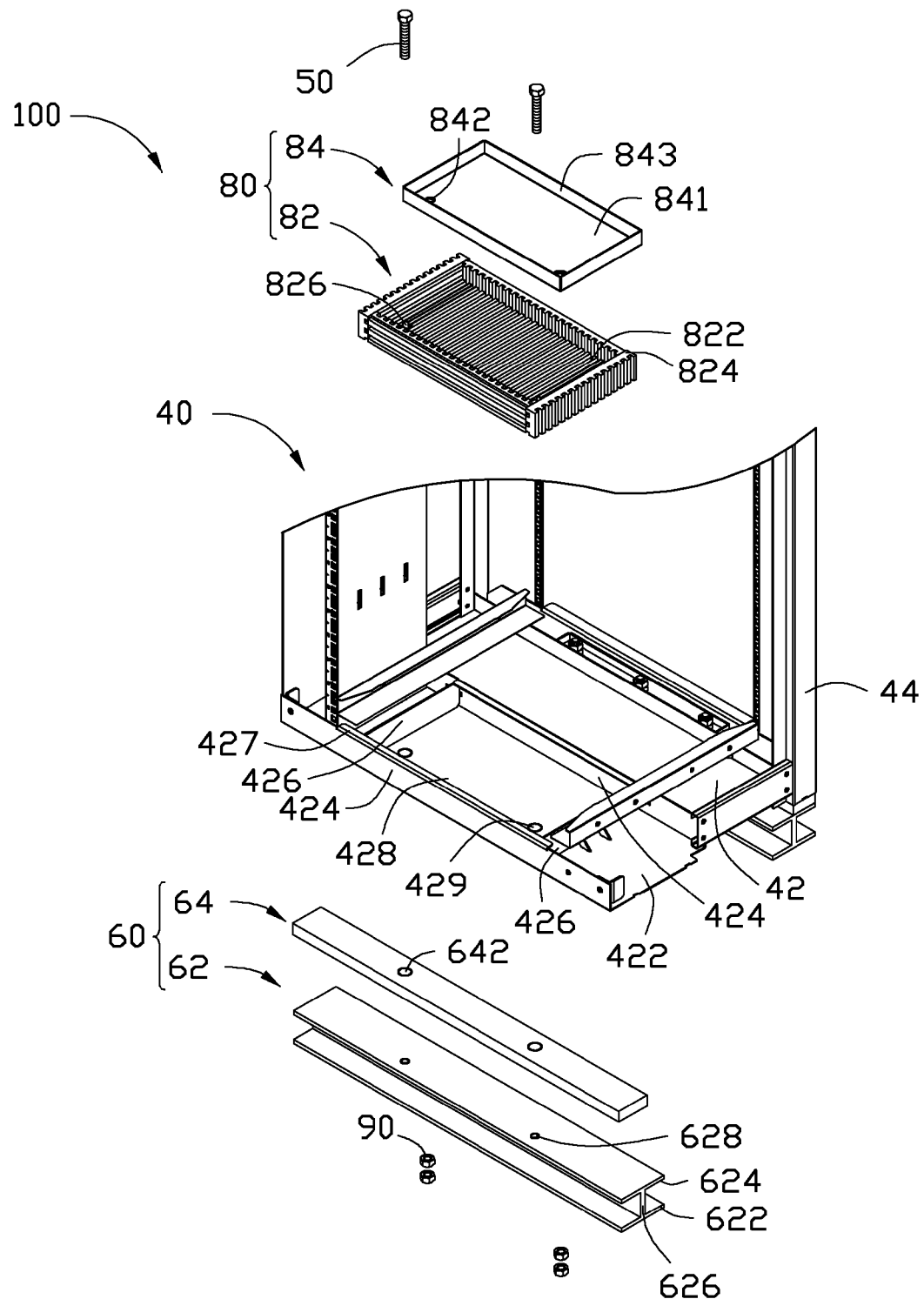
FIG. 1 is a partial, exploded, isometric view of an exemplary embodiment of a container data center.
Figure 2:
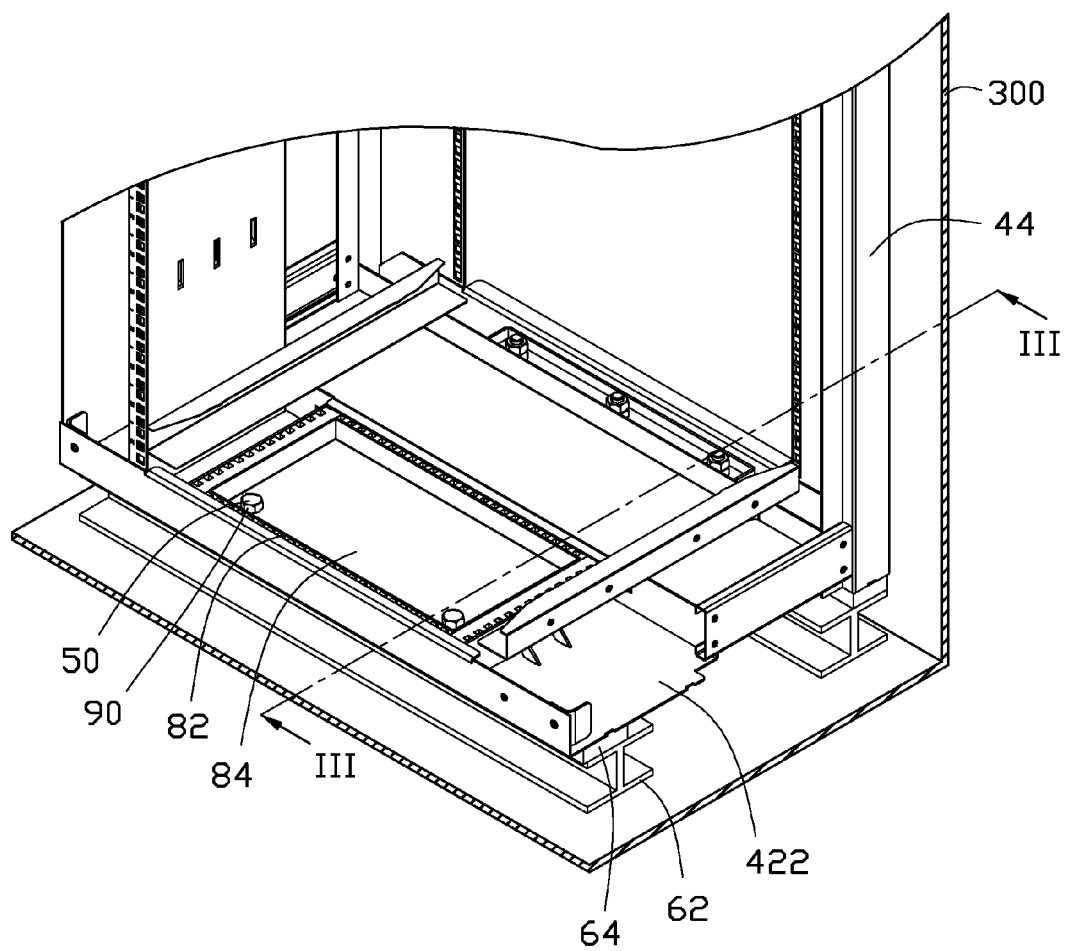
FIG. 2 is an isometric, assembled view of the container data center of FIG. 1.

Referring to FIG. 1 and FIG. 2, an exemplary embodiment of a container data center includes a container 300, and a plurality of cabinets 100 arranged in the container 300. Each cabinet 100 includes a bracket 40, a plurality of screws 50, a first shockproof device 60, a second shockproof device 80, and a plurality of nuts 90. Many servers (not shown) or other electronic devices may be installed in the bracket 40.

The bracket 40 includes a rectangular base 42 and four posts 44 extending up from the four corners of the base 42. The base 42 and the posts 44 cooperatively form a space for receiving the servers. The base 42 includes a bottom wall 422, two sidewalls 424 extending up from the two opposite sides of the bottom wall 422, and two end walls 426 extending up from the two opposite ends of the bottom wall 422. A flange 427 perpendicularly extends in from the top side of each sidewall 424 opposite to the bottom wall 422. The bottom wall 422, the sidewalls 424, and the end walls 426 cooperatively bound a receiving space 428. The bottom wall 422 defines two mounting holes 429 in the receiving space 428.

The first shockproof device 60 includes a H-section support 62 and a first shockproof member 64.

The H-section (the support 62) is made up of a long bottom plate 622, a long top plate 624 parallel to the bottom plate 622, and a connecting plate 626 perpendicularly connected between the centers of the bottom plate 622 and the top plate 624. The top plate 624 defines two fixing holes 628, to one side of the connecting plate 626.

The first shockproof member 64 is made of shockproof material, such as plastic or rubber. The first shockproof member 64 is a bar, and the length of the first shockproof member 64 is substantially equal to the length of the top plate 624. The first shockproof member 64 defines two through holes 642.

The second shockproof device 80 includes a second shockproof member 82 and a cover 84.

The second shockproof member 82 includes a rectangular shockproof piece 822 and four shockproof blocks 824 extending up from the four sides of the shockproof piece 822. The shockproof piece 822 defines two through holes 826 adjacent to one of the long shockproof blocks 824. In the embodiment, the shockproof piece 822 and the shockproof blocks 824 are made of shockproof material, such as plastic or rubber.

The cover 84 resembles a tray, and includes a rectangular bottom wall 841 and four sidewalls 843 respectively extending up from the four sides of the bottom wall 841. The bottom wall 841 defines two fastening holes 842 adjacent to one of the long sidewalls 843.

Figure 3:
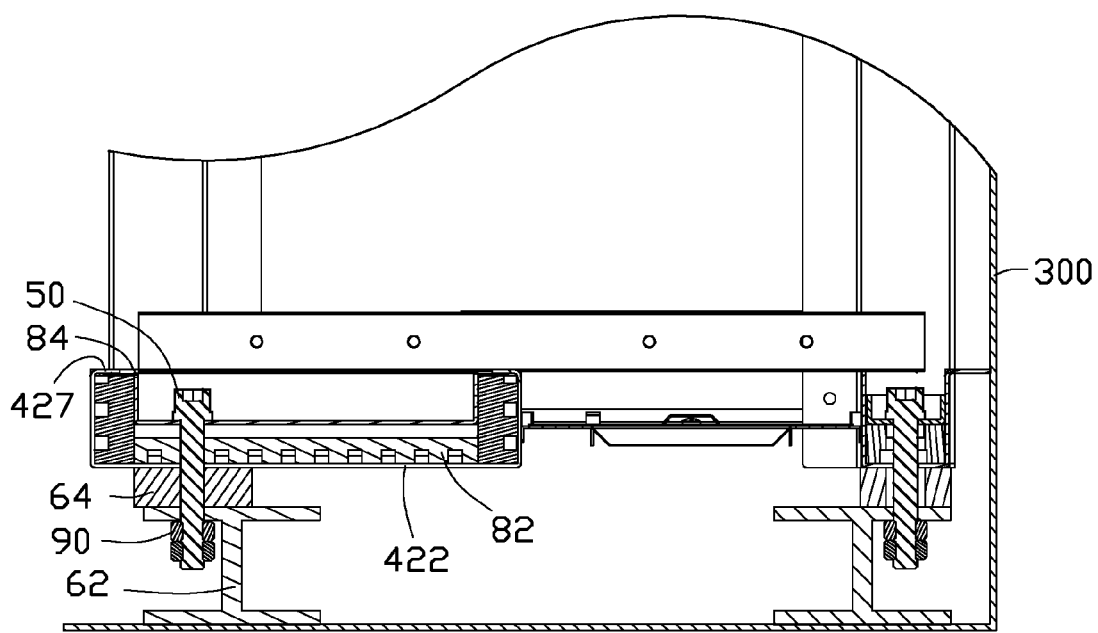
FIG. 3 is a cross-sectional view of FIG. 2, taken along the line of III-III.

Referring to FIG. 3, in assembly, the second shockproof member 82 is received in the receiving space 428. The through holes 826 of the second shockproof member 82 align with the corresponding mounting holes 429. Two of the shockproof blocks 824 at opposite sides of the shockproof piece 822 abut the inner surfaces of the sidewalls 424 and the corresponding flanges 427. The short shockproof blocks 824 at opposite ends of the shockproof piece 822 abut the end walls 426. The cover 84 is received in the second shockproof member 82. The bottom wall 841 of the cover 84 is supported on the shockproof piece 822, with the fastening holes 842 aligning with the through holes 826 of the second shockproof member 82. Each of the screws 50 extends through a corresponding fastening hole 842, a corresponding through hole 826 of the second shockproof member 82, a corresponding mounting hole 429 of the base 42, a corresponding through hole 642 of the first shockproof member 64, and a corresponding fixing hole 628, to be screwed into a nut 90. The first and second shockproof members 64 and 82 are thus fastened below and above the base 42.

Each cabinet 100 is fixed to the container 300 by means of the bottom plate 622 being screwed or riveted to the bottom of the container 300.

When the container 300 is shaken, the first shockproof member 64 and the second shockproof member 82 are absorbing the energy of the vibrations or shocks and prevent them being passed to the cabinet 100.

It is to be understood, however, that even though numerous characteristics and advantages of the embodiments have been set forth in the foregoing description, together with details of the structure and function of the embodiments, the present disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A container data center comprising:

a container; and a cabinet arranged in the container, wherein the cabinet comprises a bracket mounted on a bottom of the cabinet, a first shockproof device fastened on the bottom of the bracket, and a second shockproof device fastened below the bottom of the bracket;

wherein the first shockproof device comprises a first shockproof member made of shockproof material, the bracket comprises a base, the base comprises the bottom wall, two sidewalls extending up from two opposite sides of the bottom, and two end walls extending up from two opposite ends of the bottom wall, the bottom wall, the sidewalls, and the end walls cooperatively bound a receiving space for receiving the first shockproof member.

2. The container data center of claim 1, wherein the cabinet further comprises a plurality of fasteners, to fasten the first shockproof device and the second shockproof device to the bottom of the bracket.

3. The container data center of claim 2, wherein each fastener comprises a screw and a nut, each screw extends through the first shockproof device, the bracket, and the second shockproof device to be screwed in the nut.

4. The container data center of claim 1, wherein the first shockproof member comprises a shockproof piece and four shockproof blocks extending up from four sides of the shockproof piece, the shockproof piece is received in the receiving space, the shockproof blocks respectively resist against inner surfaces of the sidewalls and the end walls of the base.

5. The container data center of claim 4, wherein the first shockproof device further comprises a cover received in the first shockproof member.

6. The container data center of claim 5, wherein the second shockproof device comprises a support supported on the container and a second shockproof member mounted between the support and the bottom of the base, the second shockproof member is made of shockproof material.

7. The container data center of claim 6, wherein the support comprises a bottom plate, a top plate parallel to the bottom plate, and a connecting plate connected between the bottom plate and the top plate, the second shockproof member is mounted on the top plate.

8. The container data center of claim 7, wherein the cover defines a plurality of fastening holes, the first shockproof member defines a plurality of first through holes, the bottom wall of the base defines a plurality of mounting holes, the second shockproof member defines a plurality of second through holes, and the top plate of the support defines a plurality of fixing holes, a plurality of screws respectively extends through the fastening holes, the first through holes, the mounting holes, the second through holes, and the fixing holes, to be screwed to a plurality of nuts.

\* \* \* \* \*